United States Patent [19]

Stopperan

[11] Patent Number: 5,428,190
[45] Date of Patent: Jun. 27, 1995

[54] RIGID-FLEX BOARD WITH ANISOTROPIC INTERCONNECT AND METHOD OF MANUFACTURE

[75] Inventor: Jahn J. Stopperan, Lakeville, Minn.

[73] Assignee: Sheldahl, Inc., Northfield, Minn.

[21] Appl. No.: 87,177

[22] Filed: Jul. 2, 1993

[51] Int. Cl.⁶ ............................................. H05K 1/00
[52] U.S. Cl. ................................ 174/261; 174/250; 174/254; 174/256; 174/259; 361/757
[58] Field of Search ............... 174/250, 254, 256, 258, 174/257, 262, 263, 264, 265, 266; 361/748, 757, 767, 771, 776, 784, 792; 439/66, 67, 77

[56] References Cited

U.S. PATENT DOCUMENTS

| | | | |
|---|---|---|---|
| 2,808,352 | 10/1957 | Coleman et al. | 117/227 |
| 3,148,310 | 9/1964 | Feldman | 317/101 |
| 3,205,299 | 9/1965 | Dickie | 174/84 |
| 3,320,658 | 5/1967 | Bolda et al. | 29/155.5 |
| 3,334,040 | 8/1967 | Conrad et al. | 204/266 |
| 3,359,145 | 12/1967 | Salyer et al. | 156/1 |
| 3,362,005 | 2/1965 | Corns . | |
| 3,421,961 | 1/1969 | Joyce | 156/296 |
| 3,475,213 | 10/1969 | Stow | 117/227 |
| 3,491,056 | 1/1970 | Saunders et al. | 260/41 |
| 3,541,222 | 11/1970 | Parks et al. | 174/68.5 |
| 3,680,037 | 7/1972 | Nellis et al. | 339/61 |
| 3,774,232 | 11/1973 | May | 174/52 |
| 3,789,274 | 1/1974 | Pfister et al. . | |
| 3,795,047 | 3/1974 | Abolafia et al. | 29/625 |
| 3,823,252 | 7/1974 | Schmid | 174/68.5 |
| 3,883,213 | 5/1975 | Glaister | 339/61 |
| 3,885,173 | 5/1975 | Lee | 310/9.4 |
| 3,904,934 | 9/1975 | Martin | 317/101 |
| 3,971,610 | 7/1976 | Buchoff et al. | 339/17 |
| 3,982,320 | 9/1976 | Buchoff et al. | 29/630 |
| 4,037,047 | 7/1977 | Taylor | 174/68.5 |
| 4,064,357 | 12/1977 | Dixon et al. | 174/68.5 |
| 4,064,622 | 12/1977 | Morris et al. | 29/625 |
| 4,064,623 | 12/1977 | Moore | 29/629 |
| 4,065,197 | 12/1977 | Kuist et al. | 339/17 |
| 4,109,377 | 8/1978 | Blazick et al. | 29/626 |
| 4,113,981 | 9/1978 | Fujita et al. | 174/88 |
| 4,261,042 | 4/1981 | Ishiwatari et al. | 364/709 |

(List continued on next page.)

FOREIGN PATENT DOCUMENTS

| | | |
|---|---|---|
| 147856 | 7/1985 | European Pat. Off. . |
| 170703 | 2/1986 | European Pat. Off. . |
| 265212 | 4/1988 | European Pat. Off. . |
| 346525 | 12/1989 | European Pat. Off. . |
| 2475302 | 10/1981 | France . |
| 1065052 | 9/1959 | Germany . |
| 58-023174 | 2/1958 | Japan . |
| 61-49499 | 3/1961 | Japan . |
| 62-023198 | 1/1962 | Japan . |
| 2068645 | 8/1981 | United Kingdom . |
| 2123224 | 1/1984 | United Kingdom . |
| 2230903 | 10/1990 | United Kingdom . |

OTHER PUBLICATIONS

Adachi, Kohei, "Packaging Technology for Liquid Crystal Displays", *Solid State Technology*, Jan. 1993, pp. 63–71.

(List continued on next page.)

*Primary Examiner*—Leo P. Picard
*Assistant Examiner*—Cheryl R. Figlin
*Attorney, Agent, or Firm*—Merchant, Gould, Smith, Edell, Welter & Schmidt

[57] ABSTRACT

A multilayer rigid-flex circuit board having two or more conductive layers, with at least one rigid circuit board electrically connected to at least one flexible jumper connector or intercircuit connector circuit board, is disclosed. A conductive layer of each of the rigid circuit boards is connected electrically and mechanically to a conductive layer of the flexible jumper connector by an interconnecting adhesive layer. The interconnecting adhesive layer comprises a conductive adhesive material having a plurality of deformable, electrically conductive particles dispersed substantially throughout a non-conductive adhesive. The fabricated multilayer circuit boards have interconnections which are reliable, heat resistant, and capable of withstanding the mechanical strain of the interconnection and the thermal cycling and typical circuit board fabrication, finishing and assembly processes. Such a rigid-flex circuit is typically used in an environment where space is limited. During installation, the flexible connector is generally bent to adapt to the dimensional constraint of the surroundings.

20 Claims, 5 Drawing Sheets

U.S. PATENT DOCUMENTS

| | | | |
|---|---|---|---|
| 4,457,796 | 7/1984 | Needham | 156/182 |
| 4,508,399 | 4/1985 | Dowling et al. | 339/17 |
| 4,508,990 | 4/1985 | Essinger | 313/50 |
| 4,511,757 | 4/1985 | Ors et al. | 174/68.5 |
| 4,554,033 | 11/1985 | Dery et al. | 156/52 |
| 4,581,679 | 4/1986 | Smolley | 361/395 |
| 4,610,756 | 9/1986 | Strobel | 156/645 |
| 4,628,022 | 12/1986 | Ors et al. | 430/280 |
| 4,629,681 | 12/1986 | Takada et al. | 430/314 |
| 4,642,160 | 2/1987 | Burgess | 156/630 |
| 4,654,552 | 2/1987 | Vitriol et al. | 156/89 |
| 4,659,872 | 4/1987 | Dery et al. | 174/117 |
| 4,709,300 | 11/1987 | Landis . | |
| 4,713,494 | 12/1987 | Oikawa et al. | 174/68.5 |
| 4,729,809 | 3/1988 | Dery et al. | 156/306.6 |
| 4,735,847 | 4/1988 | Fujiwara et al. | 428/209 |
| 4,744,850 | 5/1988 | Imano et al. | 156/265 |
| 4,771,537 | 9/1988 | Pryor et al. | 29/830 |
| 4,778,635 | 10/1988 | Hechtman et al. | 264/24 |
| 4,788,766 | 12/1988 | Burger et al. | 29/830 |
| 4,800,461 | 1/1989 | Dixon et al. | 361/398 |
| 4,812,213 | 3/1989 | Barton et al. | 204/15 |
| 4,814,040 | 3/1989 | Ozawa | 156/634 |
| 4,873,123 | 10/1989 | Canestaro et al. | 427/96 |
| 4,926,549 | 5/1990 | Yoshizawa et al. | 29/876 |
| 4,928,206 | 5/1990 | Porter et al. | 361/385 |
| 4,945,029 | 7/1990 | Bronnenberg | 430/316 |
| 5,004,639 | 4/1991 | Desai | 428/138 |
| 5,019,944 | 5/1991 | Ishii et al. . | |
| 5,041,183 | 8/1991 | Nakamura et al. | 156/264 |
| 5,044,053 | 9/1991 | Kopel et al. | 29/25.35 |
| 5,046,238 | 9/1991 | Daigle et al. | 29/830 |
| 5,072,074 | 12/1991 | DeMaso et al. | 174/254 |
| 5,084,961 | 2/1992 | Yoshikawa | 29/840 |
| 5,095,628 | 3/1992 | McKenney et al. | 29/846 |
| 5,102,343 | 4/1992 | Knight et al. | 439/67 |
| 5,121,297 | 6/1992 | Haas | 361/398 |
| 5,136,365 | 8/1992 | Pennisi et al. . | |
| 5,175,047 | 12/1992 | McKenney et al. | 428/209 |
| 5,206,463 | 4/1993 | DeMaso et al. . | |
| 5,326,732 | 7/1994 | Ogawa et al. . | |

OTHER PUBLICATIONS

Crea, John J., et al., "Development of a Z-Axis Adhesive Film for Flex Circuit Interconnects and Tab Out Lead Bonding", Reprint NEPCON West '91 Proceedings, pp. 251-259.

Fritschen, Dan, et al., "Heat Sealed Connectors An Alternative to Elastomers or Flex Circuits", *Interconnection Technology*, Jun. 1993, pp. 29-31.

Kruetter, N. P., et al., "Effective Polymer Adhesives for Interconnect", 3M Austin, Tex.

Liu, J., "Reliability of Surface-mounted Anisotropically Conductive Adhesive Joints", *Circuit World*, vol. 19, No. 4, 1993, pp. 4-11.

Reinke, Roger R., "Interconnection Method of Liquid Crystal Deliver LSIs by Tab-on-Glass and Board to Glass Using Anisotropic Conductive Film and Monosotropic Heat Seal Connectors", Elform, Incorporated, 41st Electronic Components and Technology Conference.

Excerpts from Compass Programme LCD materials, Technology/Market Update 5, pp. 5-14, 11-14, and 60-76 (1990).

Various Conductive Materials datasheets, Creative Materials Incorporated (1992-93).

"Pulse Heat Temperature Controller TC 1000" and Pulse Heat Thermal Compression Bonder RSM 4000 Elform product sheet.

Hitachi Anisotropic Conductive Film ANISOLM TM brochure.

Hitachi Anisotropic Conductive Film Anisolm AC-7073 product specifications (1993).

Nipon Graphite Industries, Ltd. MONOSOTROPIC product brochure (1991).

Sony Oriented Conduction Film Connectors CP1030 Technical Information brochure.

Sumitomo Bakelite Co., Ltd. Anisotropic Conductive Film SUMIZAC 1003 product brochure (1991).

Grove, Bruce, *interConnection Technology*, Z-Axis Adhesive Film: Innovation in Electronic Interconnection, Dec. 1992.

3M, Scotch TM 9703 Conductive Adhesive Transfer Tape product brochure (1991).

Gilleo, "A New Multilayer Circuit Process Based on Anisotropicity", draft, published in Nepcon West proceeds, (Feb. 1991).

Gilleo, "Anisotropic Adhesives: Screen-printed Electronic Assembly" *SITE*, pp. 20-23 (Apr. 1988).

Bolger, "Conductive Adhesives", Handbook of Adhesives, pp. 705-712 (date unknown).

"Z-link ® Multilayer Technology" Product Specification (date unknown).

"Shel-zac TM Anistropic Interconnect" Product Specification (Dec. 1991).

*In re Gilleo*, Appeal No. 91-1326 (B.P.A.I. 1991).

FIG. 4
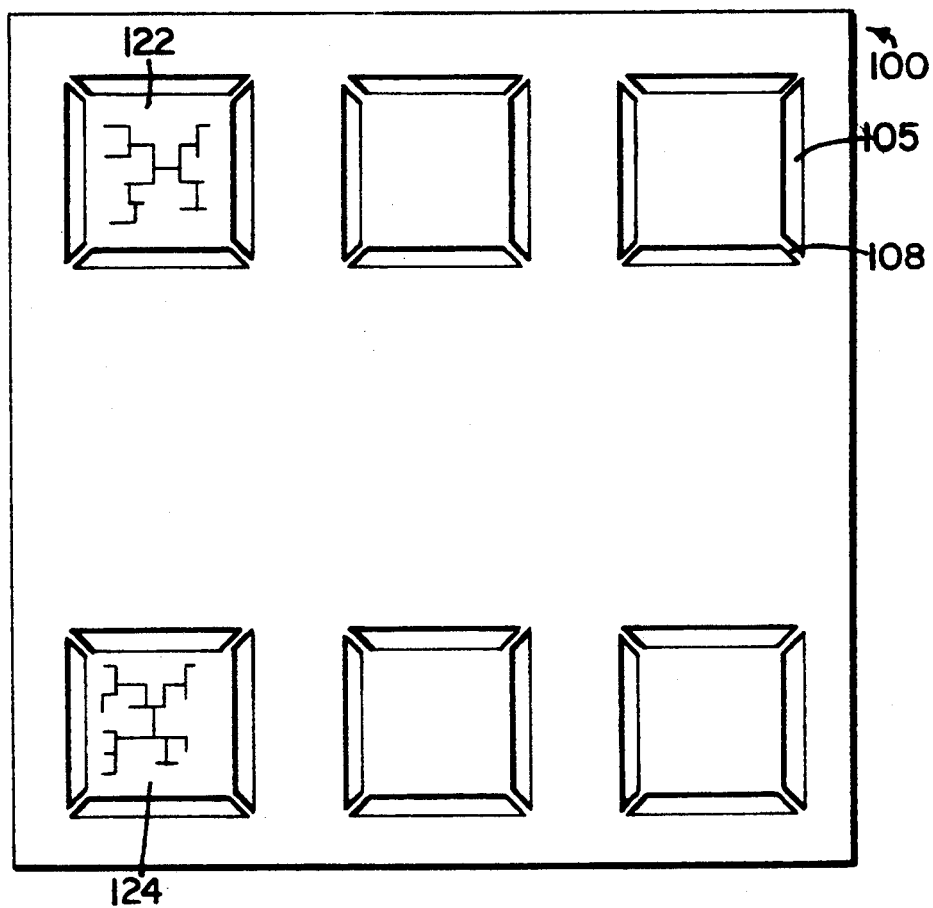
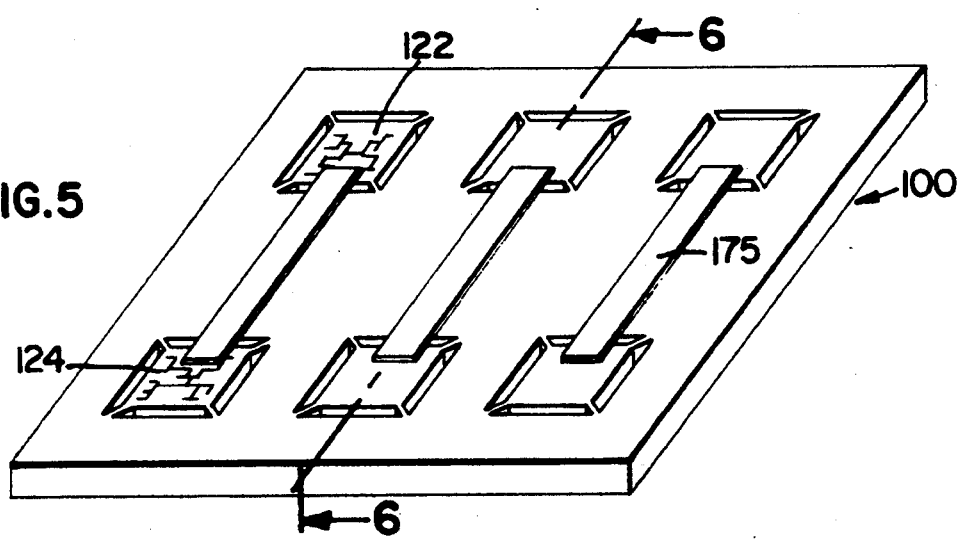
FIG. 5

FIG. 6
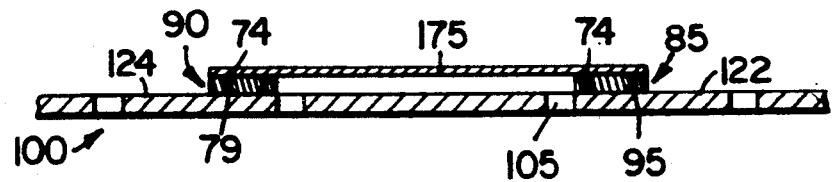
FIG. 8
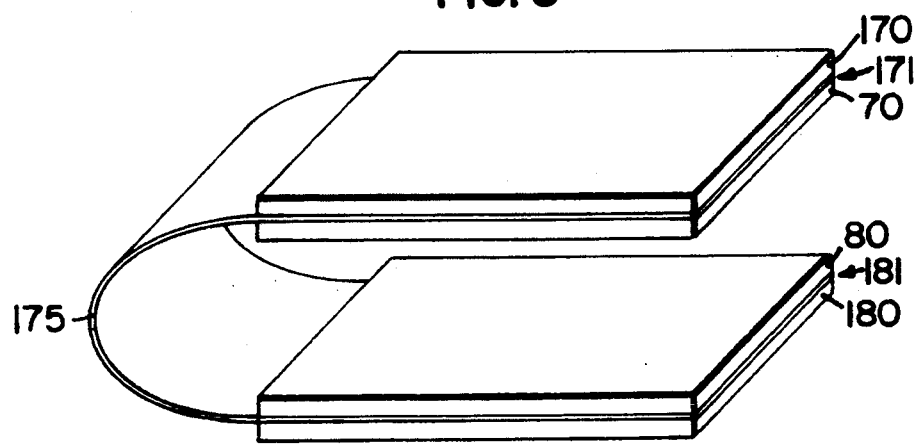
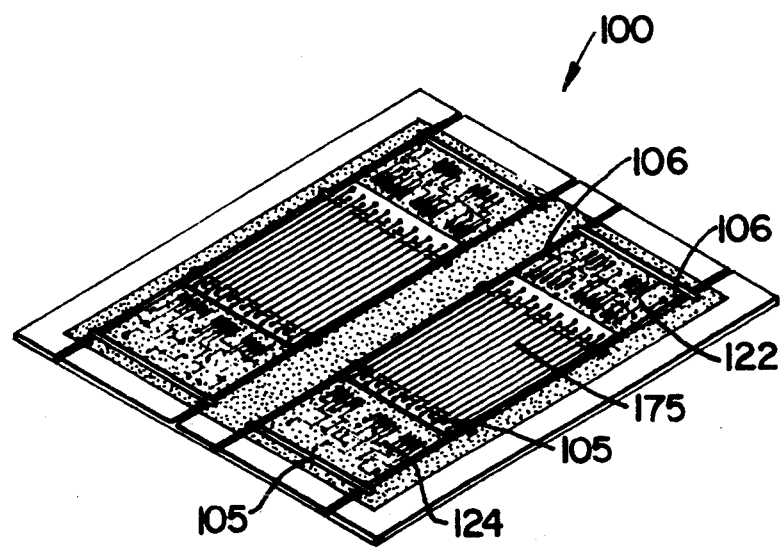
FIG. 7

RIGID-FLEX BOARD WITH ANISOTROPIC INTERCONNECT AND METHOD OF MANUFACTURE

FIELD OF THE INVENTION

The invention is directed to multilayer electronic directed to rigid electronic circuit boards connected to a flexible circuit board or jumper connector where the corresponding conductive layers of a rigid circuit board and the flexible circuit board are mechanically and electrically connected by a layer of anisotropic electrically conductive adhesive.

BACKGROUND OF THE INVENTION

At one time individual active and passive components were interconnected on a surface of a single circuit board by metal leads, wires and conductive traces. Today, as electronic systems require greater speed and complexity in smaller and smaller packages, printed circuit designers have been encouraged to develop printed circuit boards having greater circuit densities. Much of the early advances in printed circuit technology involved reductions in scale, such as by decreasing the line thicknesses for conductive traces, combining multiple functions on integrated circuit chips, and directly mounting integrated circuit chips through leaded and surface mounting processes.

Further development of printed circuit technology involved the creation of double-sided circuit boards and multilayered boards. These circuit boards typically comprise two or more conductive layers fabricated on one or more insulating substrate layers. The circuit layers are then connected by means of conductors (plated through holes) passing through the insulating layers. While early double-sided boards used insulating layers made of a rigid resin or ceramic material, many printed circuit boards in use today employ flexible substrates, typically made of a polyester or polyimide material.

However, a circuit board needs to be connected to other boards or electronic devices, power supply, etc. Initially such connections were done by point to point wiring. As the number of connections in a circuit board that need to be connected to points outside the board increase, more sophisticated interconnectors were needed. Devices such as ribbon wire connectors were utilized for such connections. In a system with many circuit boards and interconnectors for connecting the circuit boards, it is desirable for the interconnectors to be flexible. The flexibility of the interconnectors improves reliability of the interconnected circuit boards and facilitates the handling of the boards during installation and repair. These flexible interconnectors lower the risk of incorrect wiring and reduce damages on the contacting points between the interconnectors and the circuit boards due to movement and vibration. Typically, interconnectors such as ribbon wire connectors are connected to circuit boards by soldered connectors, sockets and pins, wire wraps plug-ins, zero insertion force connectors, or by conventional soldering techniques. Rather than using wires or ribbon wire connectors to connect circuit boards, a flexible circuit board can be used as the interconnector. One advantage of using such a flexible circuit board interconnector is the possibility of mounting components directly on the flexible circuit board interconnector, further increasing the circuit and component density in limited space. Other advantages are added flexibility, durability, flatness and low profile.

Flat flexible interconnectors, circuit or jumpers can be connected to circuit boards with methods of connecting layers in a multilayer circuit board. However, many of conventional methods of making multilayer circuit boards are expensive and may not be well suited for making rigid-flexible circuit boards that are able to tolerate mechanical strain, thermal cycling, vibration, and movement. There is a need for a reliable mechanical sturdy flexible interconnector for interconnecting rigid circuit boards.

There are many ways to connect circuit boards. Circuit boards in use today can be single-sided, double-sided, single-layered or multilayered. In conventional multilayer circuit fabrication, the two circuit layers on a double-sided circuit board are typically connected by the plated-through hole (PTH) method, which involves fabricating holes through the insulating layer and forming a layer of plated copper along the barrel surface of the hole to electrically connect both layers.

In multilayer printed circuit boards having two or more interconnected conductive layers, other techniques are needed to securely connect the conductive layers. One attempt to overcome the problems associated with PTH processes is shown in U.S. Pat. No. 3,795,047, issued to Abolafia et al. This reference describes a multilayer electronic circuit having limited areas of metal powder and epoxy selectively applied at electrical connection points between two conductive layers.

Due to a number of problems associated with Abolafia et al., high density multilayer circuit boards may not be reliably produced with this method. The method of applying the metal particles at selective locations on the circuit board presents a number of problems. Problems with the process include: uneven distribution of the particles and the need for the epoxy to be selectively applied to different points along the circuit board.

Finally, the process of Abolafia et al., while being conceptually simpler than the PTH process, still requires a number of steps to adequately secure the boards together. The reference requires selective registration of adhesive, application of metal powder, removal of excess metal powder, additional registration of adhesive along the other surface, and finally, alignment, pressing and heating to create the full assembly.

There are a few reference related to z-axis conductive adhesives. U.K. Patent Application No. 2,068,645 and French Patent Application No. 2,475,302 describe such an adhesive consisting of a number of silver coated glass spheres disposed within a thermoplastic material. The conductive particles are sized such that one or two of them is sufficient to bridge the gap between opposed planar conductors.

Likewise, European Patent Application No. 265,212 entitled "Electroconductive Particles and Electroconductive Adhesive Containing Said Particles" discloses conductive particles which are fine polymer particles with a thin metal layer disposed on their surfaces.

The above references are similar in the fact that the conductive particles are non-deformable. This results in connections being formed and maintained by the pressure exerted by the adhesive in holding the conductive layers together. Connections formed with this pressure-acting method are, in general, only moderately reliable, and may be prone to failure, especially during thermal cycling.

European Patent Application No. 147,856 entitled "Electrically Conductive Adhesive Sheet, Circuit Board and Electrical Connection Structure Using the Same", discloses an electrically conductive adhesive sheet having a number of electrically conductive metal particles disposed within an insulating adhesive. During a heat and pressure applying step, these particles are "squashed" between the conductive layers, and reflowed to form fused connections.

However, these conductive adhesives are unable to withstand the temperatures required for component assembly. This is because these adhesives are used after a circuit board has been component assembled. Much of the high temperature soldering processes have already been applied prior to the application of the adhesives. Therefore, they are not developed for the purpose of having heat resistant properties.

European Patent Application No. 346,525 entitled "Multilayer Electronic Circuit and Method of Manufacture," discloses a multilayer electronic circuit comprising three or more electronic circuit layers connected by an interconnector layer which contains fusible solder particles. The quantity of the particles is selected to achieve this end.

However, the conductive adhesives above do not take into account for thermal expansion, as the applications for which they are used do not typically involve high or low temperatures. Due to a mismatch in thermal coefficients of expansion (TCE) between the adhesives and the insulating substrates or films which are being connected, the connections created by these conductive adhesives may inadvertently open during thermal cycling. Finally, the adhesives themselves may not be temperature resistant, and may soften or lose their bond ply under excessive temperatures. This problem is especially prevalent in systems which undergoes repeated thermal cycling, movement, and vibration, such as in equipment used in vehicles for transportation, for example, in automobile.

Some printed circuits containing multiple layers have both rigid and flexible portions. Dixon et al., U.S. Pat. No. 4,800,461, describes multilayer rigid flex printed circuits having isolator materials which when subjected to elevated temperatures, do not expand sufficiently in the z direction to cause delamination. The multilayer rigid flex printed circuit construction contained an adhesive, and electrical conduction between the layers is provided by plate through barrels. Desai, U.S. Pat. No. 5,004,639, describes a multilayer flexible circuit. Some of the rigid layers are attached to the flexible layers by an adhesive. Electrical conduction between the layers is provided by plate through holes. DeMaso et al., U.S. Pat. No. 5,072,074, discloses a printed circuit containing multiple layers and rigid and flexible portions. The multilayer circuit contains a sheet of flexible substrate material extending over the entirety of both the rigid and flexible portions, and sheets of a rigid substrate material extending over the entirety of all of the rigid portions. A flexible adhesive material attaches a heat of flexible overlay material to the entirety of all of the flexible portions and a rigid adhesive material attaches the sheets of a rigid substrate material to the entirety of all the rigid portions. Electrical conduction through the layers is by means of plate through vias. McKenney et al., U.S. Pat. Nos. 5,095,628 and 5,175,047 describe a rigid-flex printed circuit board with a rigid insulating layer supporting one portion of the printed circuit and a flexible insulator supporting another portion of the printed circuit. The means of electrical conduction between the electrical conductive layers is not clearly described.

Attempts have been made to use flexible circuit boards to connect rigid circuit boards. Morris et al., U.S. Pat. No. 4,064,622 is related to a flexible jumper strip for connecting to printed circuits. The flexible jumper strip has conductor leads that are made into pins with a v shape. The pins are connected to printed circuit by inserting into connector holes. Dixon et al., U.S. Pat. No. 4,064,357 describe a method of electrically interconnected layers of printed circuitry. An insulator is coated on both sides with an adhesive. Holes are punched through the insulator at points wherein the connections are to be made. Printed circuit patterns are formed on both sides of the insulator. Electrical conduction between the conductive circuit patterns is by means of solder bridges formed in the interconnecting holes. Porter et al., U.S. Pat. No. 4,928,206 discuss using foldable flexible circuit panels for connecting rigid printed circuit boards to facilitate cryogenic cooling in a liquid heat sink. However, they do not describe the method of connecting the rigid boards and the flexible circuit panels in detail. Knight et al., U.S. Pat. No. 5,102,343 describe an electrical connector actuated by fluid pressure in an expandable bladder, wherein the expanding bladder exerts force against the contacts on a flexible circuit to achieve electrical connection between rigid circuit members such as printed boards. However, in none of these references was the application of an anisotropic conductive adhesive suitable for making multilayered rigid-flex circuit boards that can tolerate thermal cycling and mechanical challenge disclosed.

U.S. patent application Ser. No. 08/001,811 filed on Jan. 8, 1993 by Keith L. Casson et al. describes a multilayered circuit board containing flexible layers having an anisotropic conductive adhesive layer disposed between the circuit layers. U.S. patent application Ser. No. 08/002,177 filed on Jan. 8, 1993 by Keith L. Casson et al. describes a multilayered circuit suitable for application in a transportation environment. These two U.S. patent applications are incorporated by reference herein.

There is a need for a rigid-flex circuit board having at least one rigid board connected to at least one flexible interconnector that can be bent such that the rigid-flex board can be positioned to utilize space efficiently. The interconnection between the boards and the flexible interconnector should be capable of withstanding the stress and strain involved in the construction and final assembly at the point of use and thermal cycling and vibration. Furthermore, a need exists for a method of making such rigid-flexible circuit boards which is less complex than the prior PTH processes and which produces reliable interconnections between conductive layers. Because in certain instances rigid-flex circuit board assemblies may need to be further processed, there is further a need for a multilayer circuit made with an anisotropic conductive adhesive that is heat resistant, i.e. able to tolerate soldering where electronic components need to be affixed.

SUMMARY OF THE INVENTION

The present invention is directed to a rigid-flex circuit board containing at least one rigid circuit board connected to at least one flexible jumper wherein a conductive layer of the rigid circuit board and a conductive layer of the flexible jumper are electrically and mechanically connected by an interconnecting and anisotropic conductive adhesive layer. In this application, the term "flexible jumper" refers to a flexible connector, flexible jumper, or flexible circuit board that may contain circuits and electrical components. The flexible jumper contains electrical conducting materials, and may also contain semiconductors.

The flexible jumper may cover a portion or the entire surface of a side of a rigid circuit board. Two or more rigid circuit boards may be connected to one flexible jumper or vice versa. Further, one or both side of a rigid circuit board may be connected to one or more flexible jumpers. Likewise, one or both sides of a flexible jumper may be connected to one or more rigid boards or other flexible boards or jumpers.

In the context of the present invention, a conductive layer is a layer of a conductive material disposed generally in a plane having a conductive pattern and usually having a plurality of interconnecting pads defined thereon. Such a layer typically is made of a copper or another conductive metal, and is capable of transmitting electronic signals between components and other conductive layers electrically connected to the conductive layer. An interconnecting and anisotropic adhesive conducting layer is a layer of conductive adhesive material having a nonconductive adhesive with a plurality of metallic particles, preferably deformable and fusible, dispersed substantially uniformly throughout.

The present invention provides an circuit board assembly containing at least one rigid circuit board electrically and mechanically connected to at least one flexible jumper, the assembly hereinafter called a rigid-flex circuit board. The flexible jumper may be a connector or a circuit board. When in use, typically the flexible jumper or circuit board is bent or twisted to enable the rigid boards to be mounted in respectively different planes.

An anisotropic interconnecting adhesive layer connects the corresponding interconnecting pads on the conductive layers of the corresponding rigid board and the flexible jumper. Each conductive layer has a conductive pattern and a plurality of contact pads defined thereon. Further, at least one of these conductive pads is designated as an interconnecting pad for connecting electrically with an interconnecting pad on another conductive layer. At least one of the conductive layers in each circuit board is affixed to an insulating substrate.

The interconnecting adhesive layer is conductive across a thickness thereof, and nonconductive throughout the adhesive layer coplanar direction thereof. It is disposed substantially throughout a overlapping portion of the two conductive layers, and is made of a plurality of conductive metallic particles dispersed substantially uniformly throughout a nonconductive adhesive such that each particle is electrically insulated from substantially every other particle. Such conductive metallic particles are preferably deformable, fusible and generally have a size in the range of about 100 mesh to 500 mesh.

The present invention also provides a method for making a rigid-flex circuit board with at least one rigid circuit board electrically and mechanically connected to at least one flexible jumper. This method contains the steps of layering an interconnecting anisotropic adhesive over the conductive layer of either the rigid circuit or the flexible jumper, aligning the corresponding conductive layer of the corresponding circuit board to form an uncured assembly, such that the interconnecting layers are interposed between the two conductive layers, and subjecting the uncured assembly to an elevated temperature and a clamping pressure to form an interconnected assembly. The procedure results in an interconnecting layer which is conductive across a thickness thereof and nonconductive throughout a coplanar direction thereof, resulting in the two conductive layers being mechanical connected in a superposed relationship and electrically connected between corresponding interconnecting pads on the two conductive layers. Preferably the interconnecting layer contains a thermosetting resin. More preferably the interconnecting layer contains an epoxy resin. It is preferable that the metallic particles dispersed in the interconnecting adhesive layer are substantially spherical, and more preferable that about 80% of the particles have a diameter within 20% of a mean diameter. It is preferable that the particles are made of a eutectic solder containing about 63 parts of tin and about 37 parts of lead. Another preferable composition of the particles is an eutectic solder containing approximately 62.5 parts of tin, about 36.1 parts of lead, and about 1.4 parts of silver. An optional and preferable feature is an electrically insulating coverlayer interposed between one of the conductive layers and the interconnecting adhesive layer. The coverlayer has apertures defined therein corresponding to the interconnecting pads on each conductive layer to be connected by the interconnecting adhesive layer, wherein the conductive layers are interconnectable only through the apertures in the coverlayer.

A method for making rigid-flex circuit boards is also provided in accordance with the present invention. The method includes the steps of fabricating sets of rigid circuit boards on a rigid panel, connecting the rigid circuit boards in each set with one or more flexible jumpers, and separating the connected circuit boards from the panel. In this method, circuit patterns corresponding to rigid circuit boards are fabricated on the rigid panel. Panel material is then removed from the periphery of each circuit pattern, forming scorelines, slots, grooves, holes, etc. on the rigid panel to facilitate the separation of the resulting rigid circuit boards from the panel after the rigid-flex circuit boards are formed. Flexible jumpers suitable for connecting the rigid circuit boards are made. An electrically interconnecting adhesive is disposed between a terminus of each jumper and the corresponding rigid board, with the flexible jumper and the corresponding rigid board in alignment. The rigid panel, electrically interconnecting adhesive, and flexible jumpers form an assembly. The assembly is cured at an elevated temperature and a clamping pressure. After curing, the rigid-flex circuit boards are removed from the rigid panel by breaking off the rigid circuit boards from the rigid panel along the scorelines, slots, grooves, holes, etc. This method is suitable for making many copies of a rigid-flex circuit board by fabrication the copies simultaneously on a rigid panel. The assemblies of the invention have the capability to survive hot air solder leveling. The assemblies can be fluxed and immersed in a molten solder bath and can be blown with compressed hot air to adjust solder add-on and to remove solder from via holes etc.

BRIEF DESCRIPTION OF THE DRAWINGS

Referring to the drawings, wherein like numerals represent like parts throughout the several views:

FIG. 4 is a plan view of a rigid panel with three sets of circuit boards, each set consisting of two rigid circuit board to be connected by a flexible jumper circuit board.

FIG. 5 is a perspective view of the rigid panel of FIG. 4 with the flexible jumper circuit boards in place.

FIG. 6 is a cross sectional view of FIG. 5 along the line 6—6 showing the relation between the flexible jumper, the rigid panel, and the adhesive layer without showing details.

FIG. 7 is a perspective view of the preferred embodiment with a slotted and scored rigid panel having the flexible jumpers in place.

FIG. 8 is a perspective view of a rigid-flex circuit board in which each terminus of a flexible jumper is connected to two rigid circuit boards, each side of each terminus of the flexible jumper is connected to a rigid circuit board.

DETAILED DESCRIPTION OF THE PREFERRED EMBODIMENT

For the purposes of discussing the workings of the present invention, the fabrication of a two-ended rigid-flex circuit board, containing four conductive layers in each terminus, will be disclosed as an example. This will serve to illustrate the principles embodying the present invention, and will facilitate the further discussion of alternative applications of the present invention in other embodiments.

CIRCUIT BOARDS

Figure 1A:
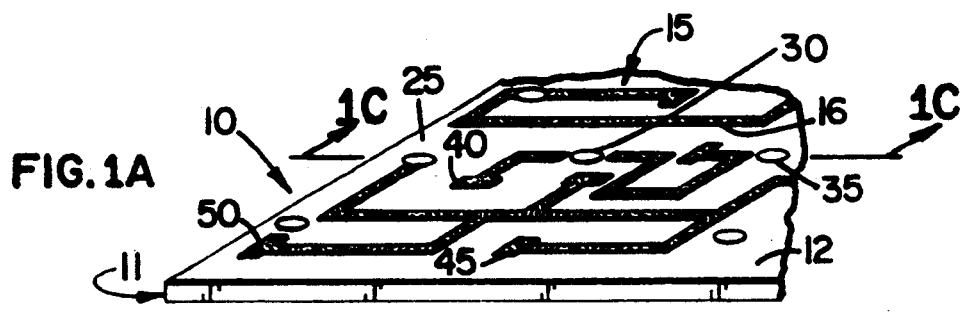
FIG. 1A is a perspective view of the top side of a double-sided circuit board for use with the present invention.
Figure 1B:
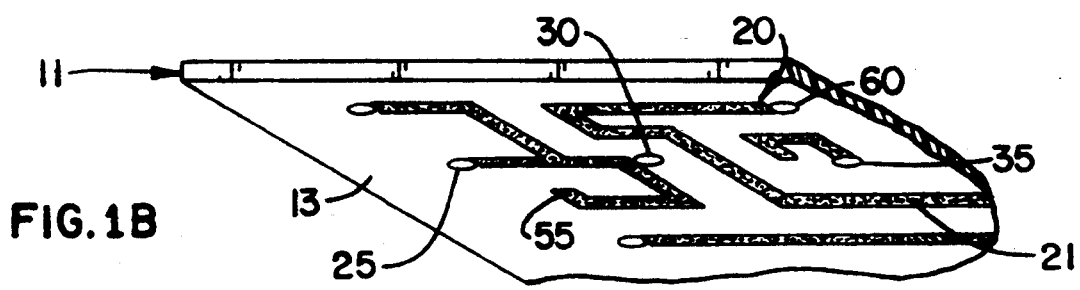
FIG. 1B is a perspective view of the bottom side of the double-sided circuit board of FIG. 1A.
Figure 1C:
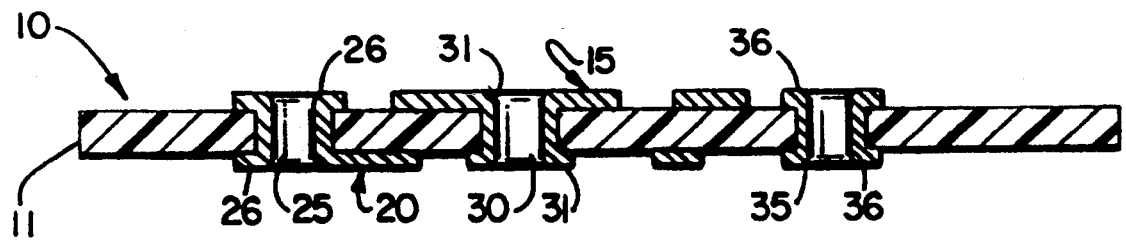
FIG. 1C is a sectional side view of the double-sided circuit board taken along line C—C in FIG. 1A.

As an illustration, a preferred embodiment of a rigid-flex circuit board containing four conductive layers on each terminus of the rigid-flex board is described herein. This rigid-flex circuit board is fabricated by electrically connecting two rigid boards and one flexible circuit jumper together in a superposed relationship. The flexible circuit jumper is also a double sided circuit board containing two conductive layers. FIGS. 1A–C show a typical double-sided board for use in a multilayer circuit of this unique construction (not to scale). The double-sided circuit board 10 shown in the Figures is formed by adhering conductive layers on each side of an insulating substrate 11. Insulating substrate 11 can be any of a number of suitable dielectric materials such as ceramic, glass or organic polymers. In the case of a rigid board, it is typically made of ceramic, epoxy-glass, fabric or other composite materials. In the case of a flexible circuit, such as a flexible jumper circuit board, the substrate is typically polymeric, preferably epoxy-glass, polyester or polyimide. Insulating substrate 11 will typically provide the significant portion of the rigidity of the multilayer circuit, so it should therefore have good strength characteristics. Typical thickness of an insulating substrate can be from about 12.5 to 125 microns for the flexible board and about 200 microns to 2400 microns.

On each surface of substrate 11 (top side 12 in FIG. 1A and bottom side 13 in FIG. 1B), conductive layers typically made of copper are formed thereon (15, 20). Upper conductive layer 15 has a pattern 16 of the various interconnecting lines defined thereon. Furthermore, it has a number of contact pads, such as 40, 45 and 50. Some or all of these pads are interconnecting pads, which are used to electrically connect conductive layer 15 to another conductive layer located on another circuit layer. Likewise, lower conductive layer 20 on bottom side 13 of substrate 11 contains conductive pattern 21 of various interconnecting lines. Conductive layer 20 also includes a number of contact pads, such as pads 55 and 60, some or all of which are also interconnecting pads used for connecting conductive layer 20 to another conductive layer on another assembly.

The minimum spacing between lines on a conductive layer or the minimum dimension of a pad may be as small as in the range of about 25 microns. Line spacing will generally be greater than about 100 microns in most applications.

Conductive layers 15 and 20 are electrically connected through substrate 11 at various points by plated through holes (PTH), such as holes 25, 30 and 35. Copper barrels 26, 31 and 36, formed along the inner surface of the holes 25, 30 and 35, respectively, provide the necessary electrical connections between the layers. Conductive layers 15 and 20 are formed on insulating substrate 11 by known methods such as laminating, imaging and etching, electroless and electrolytic plating processes. These processes typically proceed by first plating top side 12 and bottom side 13 of substrate 11 with a conductive metal such as copper by electroless and/or electrolytic plating. A photoresist is then laid down over the conductive metal on each side of the substrate, and then the photoresist is exposed to a light or other radiation image of the desired circuit pattern. That is, a light image of pattern 16 applied to top side 12 of substrate 11, and a light image of conductive pattern 21 will be applied to bottom side 13 of substrate 11. The unexposed photoresist is then removed, and the portion of the conductive metal from which unexposed photoresist has been removed is etched away, leaving only the desired conductive circuit patterns. The remaining photoresist is removed after etching. Typically the conductive layers formed will generally be about 15 to 70 microns in thickness.

Also, a further process may be used to specially clean or treat the copper interconnecting pads to improve the wetting property on the pads to promote good anisotropic interfacial bond. This may be performed by exposing the circuit boards to solutions containing sodium persulfate or sulfuric acid, for example.

The two conductive layers are interconnected through the insulating substrate by the plated through hole (PTH) process. These holes can be formed by mechanical piercing, rather than drilling, as is required for forming plated through holes through more than one insulating substrate. A conductive metal such as copper is then plated onto the walls of the holes by conventional electroless and/or electroplating methods. If the thickness of the substrate 11 used is relatively thin, for example, a few mils, the length of the copper barrels is therefore also only a few mils (the total thickness of substrate 11 and conductive layers 15 and 20), and thermomechanical stress is never a problem, even at relatively high processing or operating temperatures.

Finally, double-sided board 10 may further include active or passive circuit components (not shown) formed thereon by known methods. These components can include semiconductor transistors or diodes, surface mounted or leaded integrated circuits, capacitors, or resistors (including thin or thick film resistors).

ANISOTROPIC CONDUCTIVE ADHESIVE

A rigid-flex circuit board consistent with the present invention is formed having a conductive layer of at least one flexible jumper and a conductive layer of at least one rigid circuit board electrically and mechanically interconnected by a layer of anisotropic conductive adhesive. By anisotropic conductive adhesive, we mean an adhesive which, when layered between two conductive layers, will be electrically conductive at any point across a thickness thereof (also designated the z-axis), but will be electrically insulating throughout the layer in any coplanar direction (also designated x- or y-axis).

The preferred conductive adhesive has a number of electrically conductive particles precisely dispersed in an electrically insulating adhesive material. The conductive adhesive, once manufactured, may either be coated, screen printed, or otherwise spread onto a conductive layer or alternatively, may be coated onto a release film and dried for later use.

The electrically conductive particles are large enough to span the connected distance between two conductive layers. That is, when two conductive layers are connected by a layer of conductive adhesive, the particles should have a maximum diameter sufficient to make physical contact between opposing interconnecting pads on the conductive layers. The size of the particles must be properly matched to the connected distance between opposing conductive layers, rather than the thickness of the layer of conductive adhesive or the connected distance between insulating substrates. This is because the conductive adhesive will be layered substantially throughout the space between opposing insulating substrates. This dimension can vary greatly depending upon the thickness of the conductive layers, which may vary greatly based on the proper laminating process used. It is preferable that the particles have a size larger than the connected distance between opposing conductive layers. Furthermore, it is preferable that the particles are roughly the same size, for example with 80% of the particles having a maximum diameter within 20% of a mean maximum diameter. Also, the relationship between the maximum particle diameter and the minimum conductive line spacing will typically be greater than 1:3.

The particles are preferably deformable amorphous bodies. Particles are more preferably substantially spherical in shape, and made of a eutectic solder alloy. One preferred solder particle composition is a tin-lead eutectic solder, having a tin/lead ratio of 63:37 and a melt point of 361° F. Another preferred solder particle composition is a tin/lead eutectic solder, with a tin/lead/silver ratio of 62.5:36.1:1.4, with a melting point of 355° F.

It has also been found that more reliable connections may be made in some applications by adding a number of smaller conductive metallic particles to the conductive adhesive, which are not sized to span the connected distance between conductive layers. The use of the smaller particles, as well as the percentage of particles used, will vary depending on the application in which the conductive adhesive is to be used. For a preferred conductive adhesive used with a connected distance of 50 microns, it has been found that two sizes of particles should be mixed together in the insulating adhesive in equal portions for reliable connections. In the preferred conductive adhesive, a −200 to +325 mesh conductive powder is used in equal proportion with a −500 mesh conductive powder. However, it should be understood that reliable connections would still be made using particles that are outside this range.

The insulating adhesive used in the conductive adhesive may be any dielectric substance, including, but not necessarily limited to, non-conducting plastics and resins, ceramics, and glasses. The insulating adhesive should have good wetting properties so as to completely coat each conductive particle so that, unless acted upon by external forces, the particles will stay dispersed and out of contact with one another. Preferably, the insulating adhesive is a thermosetting plastic. For a screen printable adhesive, a preferred composition of the base resin of the insulating adhesive is:

| Material | Solid Weight % |
| --- | --- |
| Butvar 90 (polyvinyl) | 74.78% |
| Cab-O-Sil (filler) | 7.79% |
| Antifoam A (wetting agent) | 1.24% |
| Epon 872 × 75 (epoxy) | 16.19% |

The base resin is prepared by first placing Cyclohexanone and Butyrolactone solvents into a mixer along with the Epon 872×75 and Antifoam A. Preferably a Daymax mixer may be used, with its three baffles installed at 90° in its walls, and with cold water circulating in the dispenser jacket. In order to prepare 10 gallons of base resin, the solvents, epoxy and wetting agent are added in the following quantities:

7399.9±15 grams of Cyclohexanone
7399.9±15 grams of Butyrolactone
571.6±1 gram of Epon 872×75
32.6±1 gram of Antifoam A The mouth of the mixer is covered with a sheet of plastic film, the protective grid and port cover are put into place, and the mixer is activated for one minute. The mixer is then opened, and the following materials are added:

204.6±1 gram of Cab-O-Sil
1980.0±4 grams of Butvar 90

The mouth of the mixer is again covered with a sheet of plastic, the protective grid and port cover are put into place, and the mixer is activated for one minute ±10 seconds. The mixer is then opened, and any dry ingredients from the wall of the mixer is deposited in the center of the resin batch. The water is then turned on to the water jacket, the mouth of the mixer is covered with a sheet of plastic, the protective grid and port cover are put into place, and the mixer is activated for an additional 20 minutes. At this point, the resin must appear to be clear, and the butvar and Cab-O-Sil must be completely dissolved or dispersed. The base resin may now be drained into a polyethylene drum and sealed tightly for storage in a freezer.

Conductive particles and a phenolic resin are blended with the base resin in a separate process. The premixed base resin must first be allowed to reach room temperature (if frozen) before use. This base resin is first put into a blender and sheared (not whipped with high agitation)

for 2-3 minutes, or until it is a fluid and pourable mixture, with care being taken to not heat the resin during mixing.

To form the conductive adhesive, the base resin and Union Carbide BLS 2700 phenolic resin are placed in a one quart explosion-proof blending jar and sealed in the following quantities:

602±1 gram of base resin
49.7±0.5 grams of Union Carbide BLS 2700

This mixture is sheared (not whipped) for 2-3 minutes, with care being taken not to allow the mixture to heat during mixing. Next, the conductive particles (63:37 tin:lead eutectic solder) are added in the following quantities:

102.3±0.5 grams of −200 to +325 mesh powder
102.3±0.5 grams of −500 mesh powder

These particles are weighed separately in a clean glass beaker, and are added slowly to the slope of the vortex as the adhesive mixes. The mixture is then mixed for 1-2 minutes on low speed or until the conductive particles are uniformly distributed throughout, with care being taken not to allow the mixture to heat. The resulting conductive adhesive has the following composition:

| Material | Solid Weight % |
| --- | --- |
| base resin | 70.30% |
| −200 to +325 mesh powder | 11.95% |
| −500 mesh powder | 11.95% |
| BLS 2700 phenolic resin | 5.80% |

The thermosetting property of the adhesive enables the conductive particles to be firmly secured in place between the conductive layers. Migration of the particles is prevented by the thermoset adhesive, and as the adhesion and wetting properties of the adhesive effectively isolate each conductive particle. Therefore, once the adhesive is cured, no conduction will be possible between adjacent particles within the conductive layer, and the conductive adhesive layer will be substantially anisotropic.

The number of particles in a given volume of insulating adhesive must be determined statistically. In particular, the number of particles is chosen to keep the probability of short circuits between paths, along the x and y axis, to an acceptable minimum (usually less than one in one million). Within these constraints it is also desirable to maximize the current handling through a desired z-axis path, and if desired, to reduce the amount of surface area for interconnecting pads required to make good electrical contact. Usually the loading is between 10% and 30% by weight and should not exceed Critical Volume Loading (where the insulating adhesive does not coat all of the surface area of the particles). For the preferred conductive adhesive discussed above, the particle loading is 23.9%.

Good electrical contact between conductive layers usually requires that an electrical conductor contact the surface over a surface area at least sixteen times the thickness of the connecting area squared ($s = 16 \times t^2$), and preferably more than fifty times the thickness squared. Greater joint areas result in more durable and reliable circuit constructions.

In order to make the conductive adhesive resistant to the effects of temperature, the thermal coefficient of expansion for the conductive particles should be sufficiently matched with the TCE of the insulating substrates used in the multilayer circuit. This allows the conductive particles in the adhesive and the substrates to expand at substantially the same rate across the anisotropic bond ply thickness. For the preferred conductive adhesive, the TCE for the conductive particles is 25 ppm/°C. and the TCE for the insulating substrate is 20 (for polyimide films) to 27 (for polyester films) ppm/°C. A typical TCE for an epoxy-glass (FR4) composite rigid substrate is 15.8 ppm/°C. These TCE values, for the conuctive particles, the board substrate and the insulating layer are preferabley kept at within ±25%, preferably ±10%. The adhesive without the particles has a TCE of 420 ppm/°C.

The measurement of TCE may be performed by using a thermal mechanical analyzer while exposing layers of material to be tested to varying temperatures. For example, one test cycle would be a 10° C./minute ramp back and forth between 25° C. and 200° C., with a 2 minute hold time at the first 200° C. reading.

Finally, the adhesive has a number of additional beneficial properties. It has a number of methods of application, including screen printing, selective application, and casting onto a film. Further, the adhesive may be drilled, punched, cut, etc. after being deposited and set.

FORMING A MULTILAYER RIGID-FLEX CIRCUIT BOARD

A rigid-flex board is formed by electrically and mechanically connecting at least one rigid circuit board with at least one flexible jumper. For example, the flexible jumper can be a flexible circuit board having two termini, and one rigid board is connected to each terminus of the flexible circuit board. Each rigid board and the flexible jumper can be single or double sided.

An assembly of a double-sided rigid circuit board and a double-sided flexible jumper circuit board forms a four-layer multilayer circuit board. In order to construct a four-layer multilayer circuit, it is preferable to interpose a layer of anisotropic conductive adhesive between two double-sided circuit boards.

Each of the rigid circuit boards or the flexible jumper can be a single layer circuit board or a multilayer board of two or more layers. Each of the multilayer boards can be made utilizing the anisotropic conductive adhesive and/or PTH technology. One advantage of a multilayer circuit of this configuration is that heat resistant insulating substrates can be used on the outer layers on which heating processes such as soldering may be applied, and less expensive heat sensitive insulating substrates can be used for the inner layers. The heat resistant insulating layers for the outer insulating substrates may be made of, for example, ceramic, polyimide, polyimide epoxy composite, glass epoxy composite, and certain resin such as thermoset phenolic and tetrafluoroethylene fluorocarbon polymer (PTFE). These materials may be used for making the substrate of a rigid circuit board.

The heat sensitive insulating substrates may be plastic materials such as polyethylene, polypropylene, and polyester films. Such multilayer circuits would be less expensive and/or thinner (using thinner heat sensitive substrates), while still being capable of withstanding the effects of heat during later soldering operations. For a rigid board, at least one substrate layer should be made of a rigid material to give the multilayer board rigidity. The substrate of a flexible jumper may be made of, for example, polyethylene, polypropylene, polyimide, thin glass epoxy composite and polyester films.

A RIGID-FLEX BOARD WITH 2 RIGID BOARDS AND A FLEXIBLE JUMPER

Figure 2:
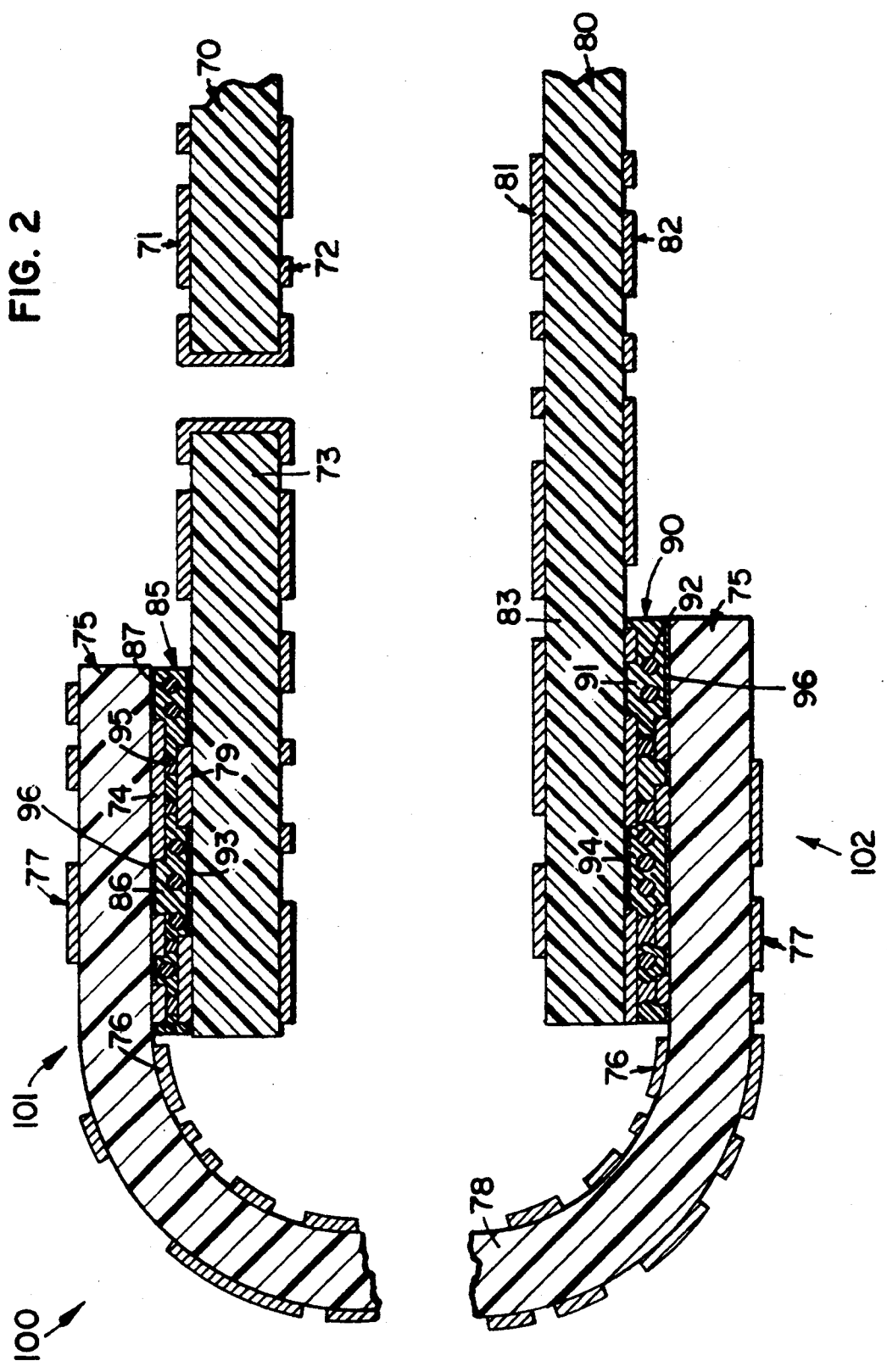
FIG. 2 is a side sectional view of a preferred rigid-flex multilayer circuit board containing two rigid boards and one flexible circuit board, each with two conductive layers.
Figure 3:
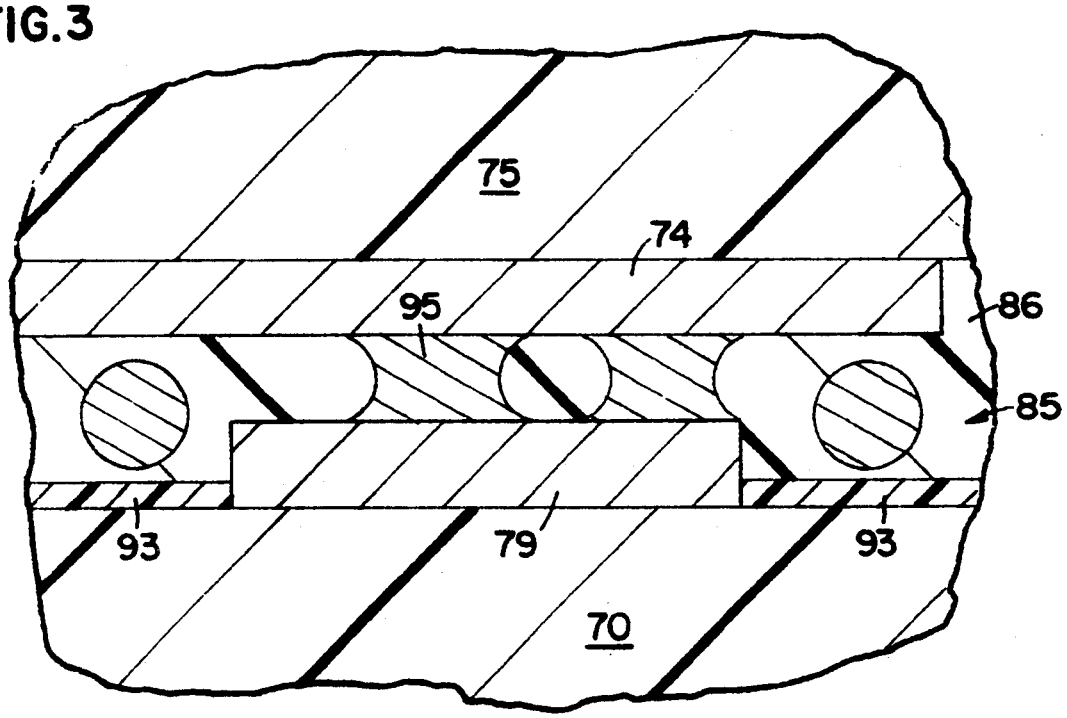
FIG. 3 is a fragmented side sectional view of an interconnection on the circuit board of FIG. 2.

FIG. 2 shows an embodiment that is a multilayer circuit (not to scale) containing a first rigid board 70, a second rigid board 80, and a flexible jumper circuit board 75, each have two conducting layers. The flexible jumper circuit board 75 has a first terminus 101 and a second terminus 102. The first rigid board 70 and the second board 80 are each a double-sided rigid circuit board. The first rigid circuit board 70 is connected electrically and mechanically to the first terminus 101 of the flexible circuit board 75 and the second rigid circuit board 80 is connected electrically to the second terminus 102 of the flexible circuit board 75 using anisotropic conductive adhesive technology. The first double-sided rigid circuit board 70 has a first conductive layer 71 and a second conductive layer 72 formed on the two sides of insulating substrate 73. Likewise, the second rigid double-sided circuit board 80 has a first conductive layer 81 and a second conductive layer 82 formed on the two sides of insulating substrate 83. The flexible jumper circuit board 75 is a double-sided circuit board having conductive layers 76 and 77 formed on a first and a second side, respectively, of insulating substrate 78, which is made of a flexible material discussed above.

The first step in constructing the multilayer rigid-flex circuit board 100 is to place coverlayers between opposing conductive layers which are to be interconnected by an anisotropic conductive adhesive. A coverlayer is a thin dielectric film with selective openings corresponding to interconnecting pads on each adjacent conductive layer. Its purpose is to insulate the two conductive layers at all locations except those places at which electrical connections are to be made. For example, a coverlayer 96 is simply placed and aligned on the one side of the flexible jumper circuit board 75. Alternatively, coverlayers 93 and 94 can be placed and aligned on the one side of the first rigid circuit board 70 and one side of the second rigid circuit board 80. Also, if desired, a coverlayer may be placed on both the rigid boards 70, 80 and the flexible jumper 75, just as long as the coverlayers are laid on appropriate locations between the conductive layers of the rigid circuit boards 70, 80 and the flexible jumper circuit board 75.

It has been found that, when using a coverlayer, a reliable interconnection between two interconnecting pads through an aperture in the coverlayer may be formed. The reliability may be optimized as a function of the ratio between the size of the aperture in the coverlayer and the connected distance between the pads on the conductive layers. Preferably, this ratio is about 25 to 1, such that when the connected distance between the conductive layers is 25 microns, the diameter of the aperture should be around 625 microns.

The step of applying a coverlayer is optional. Often it is not necessary to provide further insulation between adjacent conductive layers with proper design parameters, because the anisotropic conductive adhesive will prevent unwanted connections from being made in the x and y directions. Also, when using a coverlayer, additional plating of interconnecting pads may be included in order to raise the height of these pads in relation to the coverlayer. This will facilitate the "squashing" effect on the conductive particles located between interconnecting pads in certain applications.

In the embodiment wherein an anisotropic conductive adhesive is applied to a conductive layer of the rigid circuit board, the next step in constructing a multilayer circuit is to screen anisotropic conductive adhesive on the conductive layer. Such an anisotropic conductive adhesive is screened on the conductive layer 71 of the first rigid circuit board 70 and conductive layer 82 of the second rigid circuit board 80 to form interconnecting layers 85 and 90 respectively. If coverlayers are being used, the conductive adhesive layers will be located on top of the coverlayers as well. Typically, the thickness of this conductive adhesive layer will be in the range of 15 to 100 microns thick. An anisotropic conductive adhesive may be screened across the entire top surface of the double-sided circuit boards, or may be selectively screened only in the areas where electrical connections are desired. However, it is important to note that due to the anisotropic nature of the conductive adhesive layer, it is not necessary to limit placing the anisotropic adhesive only to locations at which electrical connections are being made.

If the conductive adhesive is being screened only onto selective portions, the screened image should be such to provide openings which are 8 mils larger than the area which is to be layered with conductive adhesive. It has been found that it is preferable to use an 80 stainless steel mesh, and a squeegee having a 70 durometer hardness and a 26 psi pressure.

Another preferred embodiment is to laid the anisotropic conductive adhesive on the flexible jumper instead of the rigid circuit board. Further, if desired, the adhesive may be laid on both the rigid circuit boards and the flexible jumper.

Once the conductive adhesive has been screened on each of the circuit boards, it is next dried in a heated oven set at 220°–250° F. for about 10 minutes. After being placed in the heated conveyor oven, the conductive adhesive becomes a B-stage adhesive.

The next step is to place and align each circuit board such that the interconnecting pads on each conductive layer are properly aligned and disposed across from the corresponding interconnecting pad with the conductive adhesive interposed therebetween. For example, in FIG. 2, interconnecting pad 74 of conductive layer 76 on terminus 101 of the flexible circuit board 75 is aligned to face interconnecting pad 79 of the first conductive layer 71 of the first rigid circuit board 70. The alignment step may be facilitated by using registering pins. Likewise, interconnecting pads of conductive layer 76 on the terminus 102 of the flexible circuit board 75 are aligned to face interconnecting pads of the second conductive layer 82 of the second rigid circuit board 80.

The next step is to laminate the entire uncured assembly to form the finished interconnected multilayer circuit assembly. The entire uncured assembly, with all of the double-sided circuit boards in alignment, is subjected to heat and pressure, preferably by a platen. Preferably this is performed at about 200 psi pressure and about 380° F. temperature. During the heating process, the adhesive in the anisotropic conductive adhesive layer is cured to form the mechanical connection between the adjacent conductive layers. Finally, the conductive particles are reflowed or fused to form secure electrical contacts between corresponding interconnecting pads. Typically, this pressing and heating step is performed in a 50–60 minute dwell time.

The pressing and heating may occur in a standard coverlayer press. Alternatively, the heating and pressing may be done in an autoclave press. Other methods of heating and pressing known in the art may also be use.

The fabricated rigid-flex multilayer circuit board shown in FIG. 2 therefore consists of six insulated conductive layers 71–72, 76–77 and 81–82. Insulating substrates 73, 78 and 83 are located between layers 71 and 72, 76 and 77, and 81 and 82, respectively. The insulating substrates for the first 70 and second 80 rigid boards are made of rigid materials such as ceramic or glass-fiber material, whereas the substrate for the flexible board 75 is made of a polymeric material. Furthermore, conductive adhesive layers 85 and 90 are interposed between layers 71 and 76, and 82 and 76, respectively. Finally, coverlayers 93 and 94 are bonded to the one side each of the first and second double-sided circuit boards 70 and 80, on top of conductive layers 71 and 82, respectively.

As can be seen in FIGS. 2 and 6, conductive adhesive layers 85 and 90 each has connective particles 87 and 92 disposed within adhesive 86 and 91. Particles are not connected in areas in which there are no opposing interconnecting pads, or in which the coverlayers insulate opposing portions of the conductive patterns. However, at portions on the conductive layers in which corresponding interconnecting pads are located, the connective particles have reflowed into solder bridges which provide secure electrical connections. For example, the particles of bridge 95 are deformed and fused between interconnecting pads 74 and 79 on conductive layers 76 and 71, respectively.

The two rigid boards and the flexible jumper can be interconnected by interconnecting to the same side of the flexible jumper, as is done in the embodiment shown in FIG. 2 and 5, or to two different sides of the jumper. In the latter case, when the flexible jumper is bent back so that the rigid boards are positioned to face each other, there is one layer of flexible jumper interposed between them.

MAKING COPIES OF RIGID-FLEX CIRCUIT BOARDS SIMULTANEOUSLY

Rigid-flex circuit boards with jumpers can be fabricated one at a time. However, a preferred method is to fabricate multiple copies of such rigid-flex circuit boards simultaneously. Processes of fabricating multiple copies of single or double sided circuit boards are well-known in the art. The above-described process of making a circuit can be applied to make multiple copies simultaneously.

FIG. 4 illustrates how three copies of a rigid-flex circuit board is made simultaneously. This method produces a rigid-flex board having a flexible jumper and two rigid printed circuit boards, each having a top circuit layer and a bottom layer. A rigid panel 100 is made by laying a conductive layer on a substrate as before. Then a photoresist is laid on top of the conductive layer. A pattern for designing circuits on the rigid panel 100 is designed in such a way that three copies of the two printed circuits, 122 and 124 are laid out over the surface of the panel 100. Circuits 122 and 124 are corresponding circuits of two rigid printed circuit boards that are to be connected by a flexible jumper circuit board 175 (see FIG. 5). One terminus of circuit 122 is to be connected by the flexible jumper 175 to a corresponding terminus of circuit 124. The pattern is designed such that the terminus of circuit 122 and the terminus of circuit 124, which are to be connected by a jumper are positioned end to end. Identical circuits of 122 and 124 are positioned side by side in a row.

Before the flexible jumpers 175 are connected to the rigid circuit boards 122 and 124, the rigid circuit boards 122 and 124 are made by applying a light image of the pattern is to the panel 100. The unexposed photoresist is removed and the conductive metal under the unexposed photoresist etched away. Likewise, conductive circuit patterns are etched on the bottom conductive layers of the panel 100. The plated through hole (PTH) process is again used for connecting the two conductive layers on a rigid circuit board. Slots 105 are routed on the panel 100 on the edges of each of the circuit patterns for the rigid circuit boards to remove part of the panel material linking the panel 100 and the circuit boards 122 and 124, leaving bridges 108 on the panel 100 to maintain dimensional rigidity.

Alternatively, scores, or holes can be cut around the circuits to weaken the mechanical connection between the rigid circuit boards and the panel. Whether panel material is removed by means of slots, score lines, holes, or other forms, the structures remaining, linking the rigid boards to the panel, are referred to as "bridges" herein. Theses slots, score lines, or holes are made so that they almost completely surround the individual patterns and enable ready removal of the circuits from the panel after completion of the rigid-flex circuit board fabrication. The objective is to allow the individual rigid printed circuit boards to remain within the panel through as many steps of the rigid-flex board fabrication as practical.

A dielectric coverlayer is laid on the top conductive layer of each of the rigid circuit boards, leaving apertures in the coverlayer for the interconnecting pads extending therethrough. If desired, the coverlayer can be omitted in certain applications if there is adequate prevention of unwanted connections. An anisotropic conductive adhesive is screened onto the top conductive layer and dried in a heated conveyor oven as described before. This anisotropic conductive adhesive on the rigid circuit board is optional if the flexible jumper is to have such an adhesive disposed on the conductive layer.

A flexible jumper is made with the method described above for making multilayer circuits, using a flexible polymeric substrate, polyimide. Three identical flexible jumpers are prepared for the three sets of identical rigid-flex boards. A coverlayer can be optionally applied on the top conductive layer of a flexible jumper. An anisotropic conductive adhesive is screened onto the conductive layer of the flexible jumper and dried in a heated oven as described before. Again, this anisotropic conductive adhesive on the flexible jumper is optional if such an anisotropic conductive adhesive has been disposed on the rigid circuit board.

Referring to FIG. 5 and FIG. 6, the panel 100 and the flexible jumpers 175 are aligned such that the corresponding interconnecting pads on each conductive layer are properly aligned and disposed across from one another with the conductive adhesive interposed therebetween, except where no connection is to be made. FIG. 6 is the cross sectional view along the line 6—6 in FIG. 5, showing the relation between the flexible jumper, the conductive adhesive layer, and the rigid panel. In another embodiment, a flexible jumper board can extend to cover all of one surface of each of the rigid circuit boards.

The entire uncured assembly is subjected to heat and pressure, preferably at about 200 psi pressure and about 380° F. temperature. After adequate dwell time for the conductive particles to reflow, typically 50–60 minutes, the assembly is allowed to cool under pressure until about 100° F. The individual rigid-flex circuit boards are then component assembled, tested and subjected to other finishing processes. Afterward, the individual rigid-flex board can be removed from the panel by breaking the bridges that link the rigid circuit boards with the panel.

An alternative to laying the anisotropic conductive adhesive layer on the conductive layer of the rigid circuit board is to lay it on the conductive layer on the flexible circuit board. The aligning, laminating and curing of the boards are similar to the procedure described above.

FIG. 7 describes yet another preferred embodiment of the present invention. Referring to FIG. 7, rigid circuit boards 122 and 124 are formed within a panel 100 as previously described. The panel 100 is scored to form parallel score lines 106 on each side of the circuits of rigid circuit boards 122 and 124, parallel to a line joining the mid points of the circuits of the rigid circuit boards 122 and 124. The score lines 106 are made to extend from one edge of the panel 100 to the opposite edge of the panel 100 so that the panel 100 can be snapped along the score lines 106 neatly. Panel material is routed away, forming parallel slots 105 on the panel 100 on each of the remaining unscored sides of the circuits of rigid circuit boards 122 and 124, the slots 105 being perpendicular to and joining the score lines 106, thereby making each rigid circuit board 122 or 124 completely surrounded by score lines 106 and slots 105.

Flexible jumpers 175 are formed as described above. A dielectric coverlayer is disposed on the conductive layer of each flexible jumper that is to be connected with a corresponding rigid circuit board, leaving aperture therein for the interconnecting pads extending therethrough. An isotropic conductive adhesive is screened on the portion of each flexible jumper to be connected to a corresponding rigid circuit board.

The Panel 100 is aligned with the flexible jumpers 175 to form an assembly such that the corresponding interconnecting pads on each conductive layer are properly aligned and disposed across from one another with the conductive adhesive interposed therebetween, except where no connection is to be made. The uncured assembly is then cured and processed further as described before. After processing, the rigid-flex circuit boards can be separated from the panel by snapping along the score lines.

In yet another embodiment, the rigid-flex circuit board can contain a flexible circuit board which itself is composed of multilayers, e.g. six conductive layers and three flexible polymeric substrate layers. The previously described method can be used for making such a multilayer flexible circuit board. The present invention may be adapted for making multilayered circuits containing many layers so long as the product retains adequate flexibly for a particular purpose. Further, A rigid circuit board can be connected by the anisotropic conductive adhesive to each surface of each terminus of the flexible jumper, as shown in FIG. 8. Referring to FIG. 8, the flexible circuit board 175 has a first terminus 171 and a second terminus 181. The two surfaces of first terminus 171 are connected to two rigid circuit boards 170 and 70 by means of an anisotropic conductive adhesive. Likewise, the two surfaces of second terminus 181 are connected to rigid circuit boards 80 and 180. In such a case, the preferred mode is for the flexible circuit board 175 to cover the entire surface of one side of each of the rigid boards 170, 70, 80, 180 so that there will not be room for the top and bottom rigid boards of such a laminate to move relative each other and to avoid having a step in the rigid-flex circuit board. Furthermore, each of the rigid boards can be composed of multiple layers, which may contain flexible layers also. It is also possible that a rigid board or a flexible board be single-sided. If desired, a rigid board in a rigid-flex board may be connected to two or more flexible jumpers, and vice versa. For example, a flexible jumper may be branched into a Y shape, each of the three ends being connected to a rigid board.

In the fabrication of a large number of rigid-flex circuit boards on a panel (e.g. tens), after the flexible jumpers are affixed in place with curing, the panel may be segregated into more manageable arrays for further processing, such as wave soldering, I/R SMD population. Such segregation may be by physically cutting the panel into smaller pieces or by isolating smaller area for the processing steps.

Rigid-flex circuit boards of the present invention are typically used in settings where space is limited and electrically circuit boards have to be densely packed. For example, the flexible jumper may have to be bent into a U shape to enable the rigid boards to double back to face each other so that the rigid boards are in close planar proximity. In such an assembly, the connection between the flexible jumper and the rigid boards are put under stress. The present invention is able to maintain electrical and mechanical integrity in such applications.

The solder particles which are disposed between interconnecting pads form fused junctions between those pads. During reflow, the solder wets the surfaces of the copper interconnecting pads and form bridges therebetween. In addition, the copper from the interconnecting pads blends with the solder along the junctions between the solder and the pads to enhance the structural integrity of the junctions. The high metal surface tension of the solder prevents these "solder bridges" from ever opening. In addition, the ductility of the solder bridges reduces the possibility of breaking the bridges due to thermal expansion. Even at molten solder temperatures, surface tension holds the solder bridges together.

Furthermore, the adhesive, being cured, further secures the electrical connections in place. The thermosetting character of the adhesive locks the solder bridges in place, and prevents their migration through the structure. Due to the heat resistance and thermosetting character of the adhesive, the electrical connections will be maintained throughout subsequent heating operations like soldering, roll tinning and hot air leveling, and throughout thermal cycling.

The method disclosed herein can be modified with standard and usual procedures for creating a number of multilayer circuit boards besides those comprised of stacked double-layer circuit boards. For instance, the method of the present invention may be used to connect back-bared layers together, single layer circuit boards to double layer circuit boards, rigid substrates to flex substrates, and flexible substrates to other flexible substrates.

Further, the method consistent with the present invention can be used to form multilayer circuits with large areas of heat sensitive substrates and smaller areas of heat resistant substrates. This is especially important in, for example, automotive applications, such as instrument panel wiring. A less expensive heat sensitive substrate such as a polyester substrate may be used for providing the conductive lines between large areas along an instrument panel. A more expensive heat resistant material, such as a polyimide substrate can be prefabricated with a completed circuit consisting of active and passive components mounted thereon. The method of the present invention can be used to form a multilayer circuit in selective areas of these two substrates. Thus, complete electronic circuits can be fabricated directly on the instrument panel circuit, but the entire instrument panel wiring does not need to be in a high cost, heat resistant substrate such as polyimide.

Although the present invention has been described with reference to the preferred embodiments, the embodiments are given for illustrative purpose only. It is possible to make changes in details and still be within the scope and spirit of the invention.

I claim:

1. A rigid-flex circuit board construction comprising:
   (a) a rigid circuit board comprising at least one conductive layer disposed on a rigid insulating substrate, the conductive layer having a conductive pattern and a plurality of contact pads defined thereon, at least one contact pad being designated an interconnecting pad;
   (b) a flexible jumper for electrically and mechanically connecting to the rigid circuit board, the flexible jumper comprising a flexible insulating substrate and at least one conductive layer, the conductive layer having a conductive pattern and a plurality of contact pads defined thereon, at least one contact pad on the flexible jumper being designated an interconnecting pad, the interconnecting pad on the flexible jumper corresponding to the interconnecting pad on the rigid circuit board; and
   (c) an electrically interconnecting adhesive layer, interposed between the conductive layer of the flexible jumper and the conductive layer of the rigid circuit board, for mechanically connecting the two conductive layers in a superposed relationship within a connected area therebetween, and for electrically connecting the corresponding interconnecting pads on the two conductive layers, the interconnecting layer being conductive across a thickness thereof and being non-conductive throughout a coplanar direction thereof, and being disposed substantially throughout the connected area of the two conductive layers, the interconnecting layer comprising a non-conductive adhesive having a plurality of deformable conductive metallic particles dispersed substantially uniformly throughout the adhesive such that each particle is electrically insulated from substantially every other particle, and the maximum particle diameter is about 90–110% of the connected distance between the two conductive layers.

2. The rigid-flex circuit board of claim 1, wherein the interconnecting layer contains a thermosetting resin.

3. The rigid-flex circuit board of claim 2, wherein the interconnecting layer contains an epoxy resin.

4. The rigid-flex circuit board of claim 1, wherein the interconnecting layer further comprises a second plurality of deformable conductive metallic particles having a diameter smaller than the first plurality of particles.

5. The rigid-flex circuit board of claim 1, wherein the particles are substantially spherical and wherein 80% of the particles have a diameter within about 20% of a mean diameter.

6. The rigid-flex circuit board of claim 5, wherein the particles are made of a eutectic solder comprising about 63 parts of tin and about 37 parts of lead.

7. The rigid-flex circuit board of claim 5, wherein the particles are made of a eutectic solder comprising about 62.5 parts of tin, about 36.1 parts of lead and about 1.4 parts of silver.

8. The rigid-flex circuit board of claim 1, further comprising an electrically insulating coverlayer interposed between the two conductive layers, the coverlayer having an aperture defined therein interposed between the corresponding interconnecting pads on the two conductive layers, wherein the interconnecting pads are electrically interconnected by the interconnecting layer through the aperture in the coverlayer.

9. The rigid-flex circuit board of claim 8, wherein the diameter of the aperture is about 25 times the connected distance between the two conductive layers.

10. The rigid-flex circuit board of claim 1, further comprising:
    (a) a second rigid circuit board comprising at least one conductive layer disposed on a rigid insulating substrate; and
    (b) a second electrically interconnecting adhesive layer, interposed between the conductive layer of the flexible jumper and the conductive layer of the second rigid circuit board, for electrically and mechanically connecting the conductive layers in the flexible jumper and the second rigid circuit board in a superposed relationship within a connected area therebetween.

11. The rigid-flex circuit board of claim 1, further comprising:
    (a) a second flexible jumper for electrically and mechanically connecting to the rigid circuit board, the second flexible jumper comprising a flexible insulating substrate and at least one conductive layer; and
    (b) a second electrically interconnecting adhesive layer, interposed between the conductive layer of the second flexible jumper and the conductive layer of the rigid circuit board, for electrically and mechanically connecting the conductive layers in the second flexible jumper and the rigid circuit board in a superposed relationship within a connected area therebetween.

12. The rigid-flex circuit board of claim 1, wherein the substrate of the rigid circuit board is selected from the group consisting of ceramic, thermoset resin, glass epoxy, tetrafluoroethylene fluorocarbon polymer and polyimide epoxy composite.

13. The rigid-flex circuit board of claim 1, wherein the flexible jumper contains a substrate made of polyimide, thin glass epoxy or polyester.

14. The rigid-flex circuit board of claim 1, wherein at least one of the circuit boards is a multilayer circuit board containing two or more conductive layers and one or more insulating substrate layers.

15. The rigid-flex circuit board of claim 14, wherein the conductive layers of the multilayer board are interconnected by means of plated through holes.

16. The rigid-flex circuit board of claim 14, wherein the substrates are about 12.5 to 125 microns thick, the conductive layers are about 5 to 140 micron thick, and the interconnecting layer is about 15 to 100 microns thick.

17. The rigid-flex circuit of claim 1 wherein the metallic particles have a size in the range of 100 to 500 mesh.

18. The rigid-flex circuit of claim 1 wherein the coefficient of thermal expansion of the metallic particles and the coefficient of thermal expansion of each substrate is within 25%.

19. A rigid-flex circuit board construction comprising:
    (a) Two rigid circuit boards each comprising at least one conductive layer, which has a conductive pattern and a plurality of contact pads defined thereon, at least one contact pad being designated an interconnecting pad disposed on a rigid insulating substrate;
    (b) a flexible jumper having a first and a second connecting terminus for electrically and mechanically connecting to the rigid circuit boards, the flexible jumper comprising a flexible insulating substrate and at least one conductive layer, each conductive layer having a conductive pattern and a plurality of contact pads defined thereon, at least one contact pad on each terminus of the flexible jumper being designated an interconnecting pad, each interconnecting pad on the flexible jumper having a corresponding interconnecting pad on the corresponding rigid circuit board; and
    (c) an electrically interconnecting adhesive layer on each terminus of the flexible jumper, each adhesive layer interposed between a conductive layer of the flexible jumper and a conductive layer of the corresponding rigid circuit board for mechanically connecting the two conductive layers in a superposed relationship with a connected area therebetween, and for electrically connecting corresponding interconnecting pads on the two conductive layers, the interconnecting layer being conductive across a thickness thereof and being non-conductive throughout a coplanar direction thereof, and being disposed substantially throughout the connected area of the two conductive layers, the interconnecting layer comprising a non-conductive adhesive having a plurality of deformable conductive metallic particles of size in the range of about 100 mesh to 500 mesh dispersed substantially uniformly throughout the adhesive such that each particle is electrically insulated from substantially every other particle, the particles and the insulating substrates connected by the adhesive having coefficients of thermal expansion such that the difference between the coefficient of the particles and the coefficient of each substrate is within 25% of the coefficient of the particle, and the maximum particle diameter is about 90–110% of the distance between two conductive layers, and wherein 80% of the particles have a diameter within about 20% of a mean diameter;
    wherein the flexible jumper is bent such that the rigid boards are in close planar proximity of each other.

20. A rigid-flex circuit board construction comprising:
    (a) a rigid circuit board including a conductive layer disposed on a rigid insulating substrate, the conductive layer having a conductive pattern with a plurality of contact pads defined thereon, at least one contact pad being designated an interconnecting pad;
    (b) a flexible jumper including a conductive layer disposed on a flexible insulating substrate, the conductive layer having a conductive pattern with a plurality of contact pads defined thereon, at least one contact pad being designated an interconnecting pad;
    (c) an electrically insulating coverlayer interposed between the conductive layers on the rigid circuit board and the flexible jumper, the coverlayer including an aperture interposed between the interconnecting pads on the rigid circuit board and the flexible jumper; and
    (d) an interconnecting adhesive layer, interposed between the coverlayer and one of the conductive layers, for mechanically connecting the conductive layers in a superposed relationship within a connected area therebetween, and for electrically connecting the interconnecting pads on the conductive layers through the aperture in the coverlayer, the interconnecting layer being conductive across a thickness thereof and being non-conductive throughout a coplanar direction thereof, and being disposed substantially throughout the connected area of the two conductive layers, the interconnecting layer comprising a non-conductive adhesive having a plurality of deformable conductive metallic particles dispersed substantially uniformly throughout the adhesive such that each particle is electrically insulated from substantially every other particle, wherein the particles have a thermal coefficient of expansion which is within 25% of the thermal coefficients of expansion of the substrates of the rigid circuit board and the flexible jumper, and wherein the maximum particle diameter is about 90–110% of the connected distance between the interconnecting pads.

* * * * *